US011122224B2

(12) United States Patent
Suh et al.

(10) Patent No.: US 11,122,224 B2
(45) Date of Patent: Sep. 14, 2021

(54) EVENT-BASED SENSOR, USER DEVICE INCLUDING THE SAME, AND OPERATION METHOD OF THE SAME

(71) Applicant: SAMSUNG ELECTRONICS CO., LTD., Suwon-si (KR)

(72) Inventors: Yunjae Suh, Suwon-si (KR); Sung Ho Kim, Yongin-si (KR); Junseok Kim, Hwaseong-si (KR); Hyunsurk Ryu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/839,812

(22) Filed: Apr. 3, 2020

(65) Prior Publication Data
US 2020/0236311 A1 Jul. 23, 2020

Related U.S. Application Data

(63) Continuation of application No. 15/725,864, filed on Oct. 5, 2017, now abandoned.

(30) Foreign Application Priority Data

Nov. 21, 2016 (KR) .......................... 10-2016-0155178
Feb. 6, 2017 (KR) .......................... 10-2017-0016371

(51) Int. Cl.
*H04N 5/361* (2011.01)
*G01J 1/44* (2006.01)
(Continued)

(52) U.S. Cl.
CPC ............... *H04N 5/361* (2013.01); *G01J 1/44* (2013.01); *H01L 27/14605* (2013.01);
(Continued)

(58) Field of Classification Search
CPC .... H04N 5/361; H04N 5/374; H04N 5/35518; G01J 1/44; G01J 2001/446;
(Continued)

(56) References Cited

U.S. PATENT DOCUMENTS 5,404,556 A 4/1995 Mahowald et al.
7,646,410 B2 1/2010 Lim
(Continued)

FOREIGN PATENT DOCUMENTS

CN 1934430 A 3/2007
CN 101399009 A 4/2009
(Continued)

OTHER PUBLICATIONS

Communication dated Apr. 20, 2018, issued by the European Patent Office in counterpart European application No. 17202609.8.
(Continued)

*Primary Examiner* — Albert H Cutler
(74) *Attorney, Agent, or Firm* — Sughrue Mion, PLLC

(57) ABSTRACT

An event-based sensor includes a dummy pixel that generates a dark current, a current mirror that generates a mirrored current using the dark current, and a sensing pixel that generates a sense current based on an intensity of incident light, and outputs an activation signal, indicating whether a variation in the incident light is sensed, based on a light current that is obtained by subtracting the mirrored current from the sense current.

19 Claims, 14 Drawing Sheets

(51) Int. Cl.
*H01L 27/146* (2006.01)
*H04N 5/374* (2011.01)
*H04N 5/355* (2011.01)

(52) U.S. Cl.
CPC .. *H01L 27/14609* (2013.01); *H01L 27/14643* (2013.01); *H04N 5/374* (2013.01); *G01J 2001/446* (2013.01); *H04N 5/35518* (2013.01)

(58) Field of Classification Search
CPC ......... G01J 2001/444; H01L 27/14605; H01L 27/14609; H01L 27/14643
See application file for complete search history.

(56) References Cited

U.S. PATENT DOCUMENTS

| | | | |
|---|---|---|---|
| 7,728,269 | B2 | 6/2010 | Lichtsteiner et al. |
| 7,989,753 | B2 | 8/2011 | Mizuno et al. |
| 8,250,010 | B2 | 8/2012 | Modha et al. |
| 8,513,892 | B2 | 8/2013 | Uedaira et al. |
| 9,087,302 | B2 | 7/2015 | Sim et al. |
| 9,104,974 | B2 | 8/2015 | Sim et al. |
| 9,143,680 | B2 | 9/2015 | Lee et al. |
| 9,201,150 | B2 | 12/2015 | Ruetten et al. |
| 9,389,693 | B2 | 7/2016 | Lee et al. |
| 9,882,574 | B2 | 1/2018 | Asayama et al. |
| 2004/0246354 | A1 | 12/2004 | Yang et al. |
| 2006/0203110 | A1 | 9/2006 | Lim |
| 2007/0023614 | A1* | 2/2007 | Park ................ H04N 5/36963 250/214.1 |
| 2008/0135731 | A1 | 6/2008 | Lichtsteiner et al. |
| 2010/0295982 | A1 | 11/2010 | Kyushima et al. |
| 2010/0299296 | A1 | 11/2010 | Modha et al. |
| 2010/0329421 | A1 | 12/2010 | Ruetten et al. |
| 2012/0084241 | A1 | 4/2012 | Friedman et al. |
| 2012/0177254 | A1 | 7/2012 | Lee et al. |
| 2012/0259804 | A1 | 10/2012 | Brezzo et al. |
| 2012/0268425 | A1 | 10/2012 | Hwang et al. |
| 2014/0320403 | A1 | 10/2014 | Lee et al. |
| 2016/0094787 | A1* | 3/2016 | Govil ................ G06F 3/0425 348/310 |
| 2016/0134822 | A1 | 5/2016 | Kosonen |
| 2016/0265970 | A1 | 9/2016 | Suh et al. |

FOREIGN PATENT DOCUMENTS

| | | |
|---|---|---|
| CN | 102203572 A | 9/2011 |
| CN | 102750045 A | 10/2012 |
| JP | 2003259228 A | 9/2003 |
| JP | 2006148455 A | 6/2006 |
| JP | 2007043689 A | 2/2007 |
| JP | 2007059991 A | 3/2007 |
| JP | 2007221368 A | 8/2007 |
| JP | 5091695 B2 | 12/2012 |
| KR | 10-0674963 B1 | 1/2007 |
| KR | 10-2013-0040517 A | 4/2013 |
| KR | 10-1512810 B1 | 4/2015 |

OTHER PUBLICATIONS

Patrick Lichtsteiner et al., A 128×128 120 dB 15 μs Latency Asynchronous Temporal Contrast Vision Sensor, IEEE Journal of Solid-State Circuits, IEEE, vol. 43, No. 2, Feb. 1, 2008, pp. 566-576, XP011200748.

Teresa Serrano-Gotarredona et al., "A 128×128 1.5% Contrast Sensitivity 0.9% FPN 3 μs Latency 4 mW Asynchronous Frame-Free Dynamic Vision Sensor Using Transimpedance Preamplifiers", IEEE Journal of Solid-State Circuits, IEEE, vol. 48, No. 3, Mar. 1, 2013, pp. 827-838, XP011494565.

Communication dated Mar. 11, 2021 by the Chinese National Intellectual Property Administration in corresponding Chinese Application No. 201711133632.5.

* cited by examiner

EVENT-BASED SENSOR, USER DEVICE INCLUDING THE SAME, AND OPERATION METHOD OF THE SAME

CROSS-REFERENCE TO THE RELATED APPLICATIONS

This is a continuation of U.S. application Ser. No. 15/725,864 filed Oct. 5, 2017, which claim for priority under 35 U.S.C. § 119 is made to Korean Patent Application Nos. 10-2016-0155178 filed Nov. 21, 2016, and 10-2017-0016371 filed Feb. 6, 2017, in the Korean Intellectual Property Office, the entire disclosures of which are incorporated herein by reference.

BACKGROUND

Apparatuses and methods consistent with exemplary embodiments of the inventive concept described herein relate to an image sensor, and more particularly, to an event-based sensor, a user device including the same, and an operating method of the same.

Human-computer interaction (HCI) can be implemented in a user interface. User interfaces that recognize a user input may provide natural interaction between a human and a computer. Various sensors may be used to recognize a user input. To provide the natural interaction, there is a need for a sensor having a fast response speed to a user input. In mobile devices, there is a need to reduce power consumption while performing various smart functions through the user interface. For this reason, a sensor having low power consumption, a fast response speed, and high reliability is needed.

SUMMARY

Exemplary embodiments of the inventive concept provide an event-based sensor having improved reliability, an operating method thereof, and an electronic device including the same, by effectively removing noise corresponding to a saturation component from a current generated from light incident on the event-based sensor.

According to an aspect of an exemplary embodiment, there is provided an event-based sensor which may include: a dummy pixel configured to generate a dark current; a current mirror configured to generate a mirrored current using the dark current; and a sensing pixel configured to generate a sense current based on an intensity of incident light, and output an activation signal based on a light current obtained by subtracting the mirrored current from the sense current, wherein the activation signal indicates whether a variation in the incident light is sensed.

According to an aspect of an exemplary embodiment, there is provided an event-based sensor which may include: a dummy pixel configured to generate a dark current and convert the dark current into a voltage; a transistor configured to replicate the dark current based on the voltage and output a mirrored current as a result of the replication; and a sensing pixel configured to generate a sense current based on an intensity of incident light, and output an activation signal based on the mirrored current and the sense current.

According to an aspect of an exemplary embodiment, there is provided an event-based sensor which may include: at least one sensing pixel configured to detect light incident thereon, and generate at least one sense current, respectively, based on the detected light; at least one dummy pixel configured to generate at least one dark current, respectively, under a light-free condition; and a current mirror configured to receive the at least one dark current, and output at least one mirrored current to the at least one sensing pixel, respectively, wherein the at least one sensing pixel generates at least one light current, respectively, by subtracting the at least one mirrored current from the at least one sense current, respectively, and generates at least one activation signal based on the at least one light current, respectively, and wherein the sensor further comprises a controller configured to generate an event signal based on the at least one activation signal.

According to an aspect of an exemplary embodiment, there is provided an operating method of an event-based sensor. The method may include: generating a dark current; generating a sense current based on incident light; generating a mirrored current by mirroring the dark current; and generating event information associated with a user input by sensing a variation in the incident light based on a light current obtained by subtracting the mirrored current from the sense current.

BRIEF DESCRIPTION OF THE FIGURES

The above and other aspects will become apparent from the following description with reference to the following figures, wherein like reference numerals refer to like parts throughout the various figures unless otherwise specified, and wherein.

DETAILED DESCRIPTION

Figure 1:
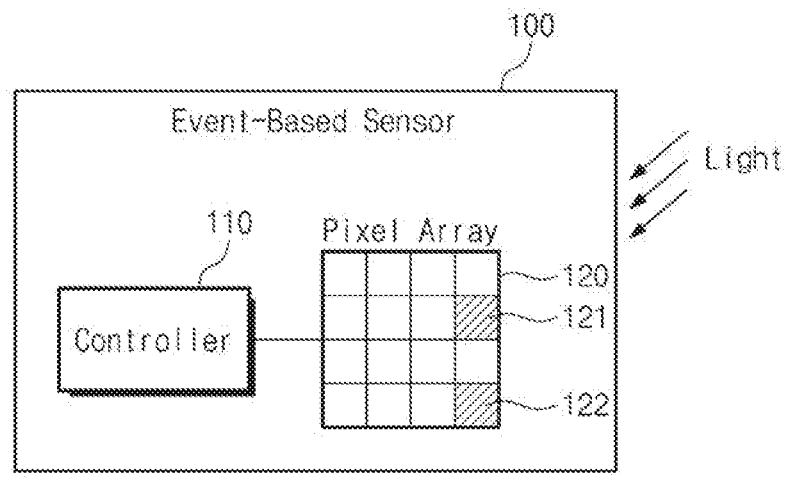
FIG. 1 is a block diagram illustrating an event-based sensor, according to an exemplary embodiment.

Structural or functional descriptions disclosed in this specification are provided only for the purpose of describing exemplary embodiments according to the inventive concept, and these embodiments may be implemented in various different forms, not being limited thereto.

The terms "first" or "second" are used to describe various elements, but it should be understood that the terms are only used to distinguish one element from other elements. For example, a first element may be termed a second element, and a second element may be termed a first element, without departing from the scope of the inventive concept.

As used herein, the singular forms "a", "an" and "the" are intended to include the plural forms as well, unless a corresponding context clearly indicates otherwise. It will be further understood that the terms "comprises," "comprising," "includes," and/or "including," when used herein, specify the presence of stated features, numbers, steps, operations, elements, and/or components, but do not preclude the presence or addition of one or more other features, numbers, steps, operations, elements, components, and/or groups thereof.

Unless otherwise defined, all terms (including technical and scientific terms) used herein are to be interpreted as is customary in the art to which the inventive concept belongs. It will be further understood that terms in common usage should also be interpreted as is customary in the relevant art and not in an idealized or overly formal sense unless expressly so defined herein.

Hereinafter, a description will be given in detail for exemplary embodiments of the inventive concept with reference to the following drawings. Further, the same reference numerals in the drawings denote the same members.

FIG. 1 is a diagram illustrating an event-based sensor, according to an exemplary embodiment of the inventive concept. Referring to FIG. 1, an event-based sensor 100 may include a controller 110 and a pixel array 120.

The event-based sensor 100 may operate based on a neuromorphic sensing technique. In more detail, a sensing pixel 121 included in the pixel array 120 may sense a change of light incident on the pixel array 120, and output at least one activation or enable (hereafter "activation") signal when the change of light incident on the pixel array 120 exceeds a threshold value. The change of light may occur by at least one of movement of an object with respect to the pixel array 120, a movement of the event-based sensor 100, a change of light projected onto the object, and a change of light radiated by the object. For example, the pixel array 120 may sense a change of light due to a hand movement of a user, and output the activation signal indicating that the change of light is sensed.

The controller 110 receives the activation signal output from the pixel array 120. The controller 110 may output an event signal in response to the activation signal. The event signal may include identification information of a pixel which outputs the activation signal and information of a time when the activation signal is output. The identification information may include an address of the pixel outputting the activation signal, and the time information may include a time stamp of a time when the activation signal is output. Since a pattern of light change is analyzed through identification information and time information included in a plurality of event signals, the event-based sensor 100 may be used to recognize a gesture of the user causing the change of light. Since the event-based sensor 100 generates and outputs an event signal without synchronization with a time, the event-based sensor 100 may operate in low power and high speed compared with a frame-based vision sensor that scans all pixels every frame.

The sensing pixel 121 may include a photo diode therein. The photo diode may generate a sense current I_PD which may be proportional to the intensity of light incident on the photo diode, and the sensing pixel 121 may output the activation signal based on the sense current I_PD. The sense current I_PD will be described with reference to FIG. 2.

Figure 2:
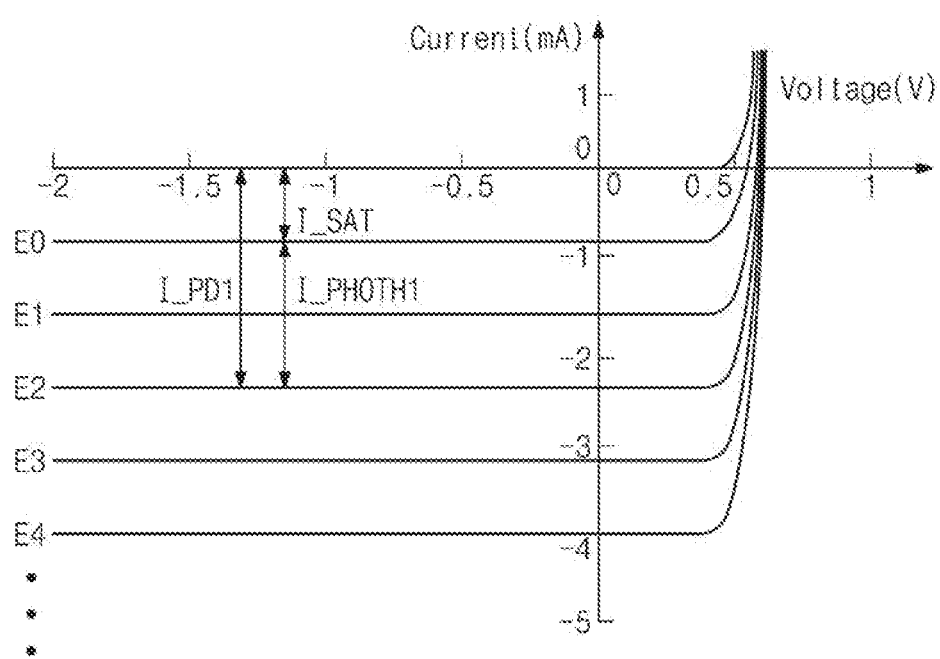
FIG. 2 is a graph illustrating a current-voltage characteristic of a photo diode included in each pixel of FIG. 1, according to an exemplary embodiment.

FIG. 2 is a diagram illustrating a current-voltage characteristic of a photo diode included in each pixel of FIG. 1. In FIG. 2, an X-axis denotes a voltage, and a Y-axis denotes a current. Curves illustrated in FIG. 2 indicate that reverse bias currents are saturated according to the intensity of light. "E0" to "E4" indicate the intensities of light at a regular interval, and "E0" indicates "0". A curve corresponding to "E0" indicates a dark current I_SAT that is generated by a photo diode in a light-free environment.

A sense current I_PD generated by a sensing pixel includes the dark current I_SAT generated in the light-free environment and a light current I_PHOTO generated according to light incident on the photo diode. For example, when the intensity of light corresponding to "E2" is incident on a photo diode, the photo diode may generate a sense current I_PD 1. In this case, the sense current I_PD 1 may include the dark current (I_SAT) and a light current (I_PHOTO1).

Since an actual component, which corresponds to incident light, of the sense current I_PD is the light current I_PHOTO, the dark current I_SAT may act as noise. The light current I_PHOTO may increase in proportion to the intensity of incident light, and the amount of the dark current I_SAT may increase in proportion to a temperature.

For example, in a case where the intensity of light incident on the photo diode is sufficient or a temperature of the photo diode is not high, a component of the sense current I_PD, which corresponds to the dark current I_SAT, may be very small. In this case, the component corresponding to the dark current I_SAT may not have great influence on sensing performance such as contrast sensitivity. However, in a case of low-illuminance environment or in a case where a temperature of the photo diode is high, a component corresponding to the dark current I_SAT may make the sensing performance low. In detail, if a component of the sense current I_PD, which corresponds to the dark current I_SAT, increases, an activation signal may be output even though a change of light does not exceed a threshold value. Influence of the dark current I_SAT due to an environment will be described with reference to FIGS. 3 and 4.

Figure 3:
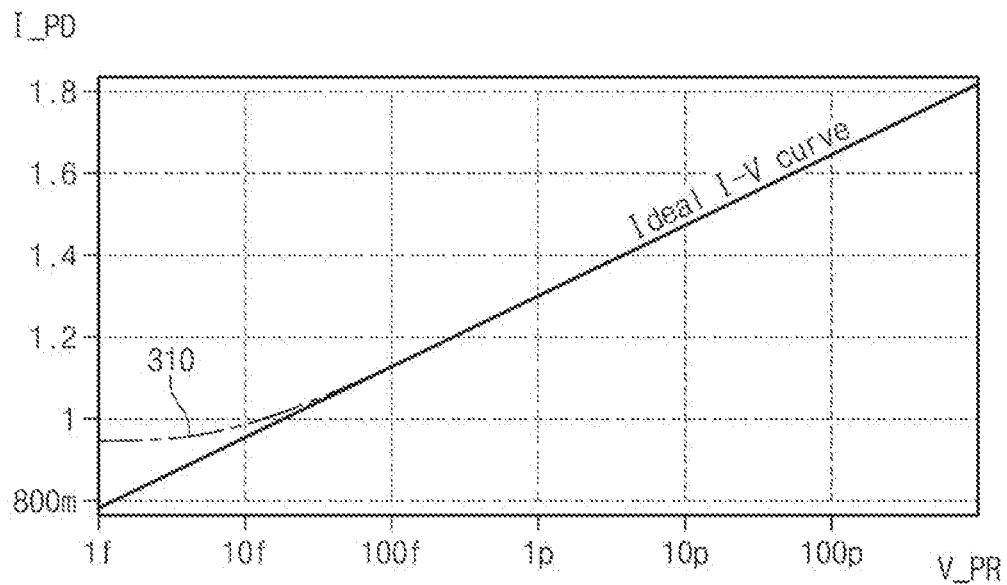
FIG. 3 is a graph for describing influence of a dark current in a low-illuminance environment, according to an exemplary embodiment.

FIG. 3 is a graph for describing influence of a dark current in a low-illuminance environment. In FIG. 3, an X-axis denotes a sense current I_PD, and a Y-axis denotes a voltage V_PR. In an exemplary embodiment, the sense current I_PD indicates a current generated by a photo diode in a sensing pixel, and the voltage V_PR may be a value that is obtained by converting the sense current I_PD of the sensing pixel. In an exemplary embodiment, a sensing pixel may output an activation signal based on variation in the voltage V_PR.

The event-based sensor may convert the sense current I_PD into the voltage V_PR, and generate the activation signal by using the voltage V_PR. For a normal output of the activation signal, the intensity of light may be directly proportional to the voltage V_PR. A dark current I_SAT may have influence on a relationship between the intensity of light and the voltage V_PR in a low-illuminance environment. According to an ideal I-V curve of the sense current I_PD and the voltage V_PR, the voltage V_PR may be directly proportional to the sense current I_PD that is generated according to the intensity of light. However, according to a curve 310 to which influence of the dark current I_SAT in the low-illuminance environment is applied, if a component of the sense current I_PD, which corresponds to the dark current I_SAT, increases, a direct proportional relationship between the sense current I_PD and the voltage V_PR is not formed. Accordingly, the performance of the event-based sensor may decrease due to noise that is based on the dark current I_SAT in the low-illuminance environment.

Figure 4:
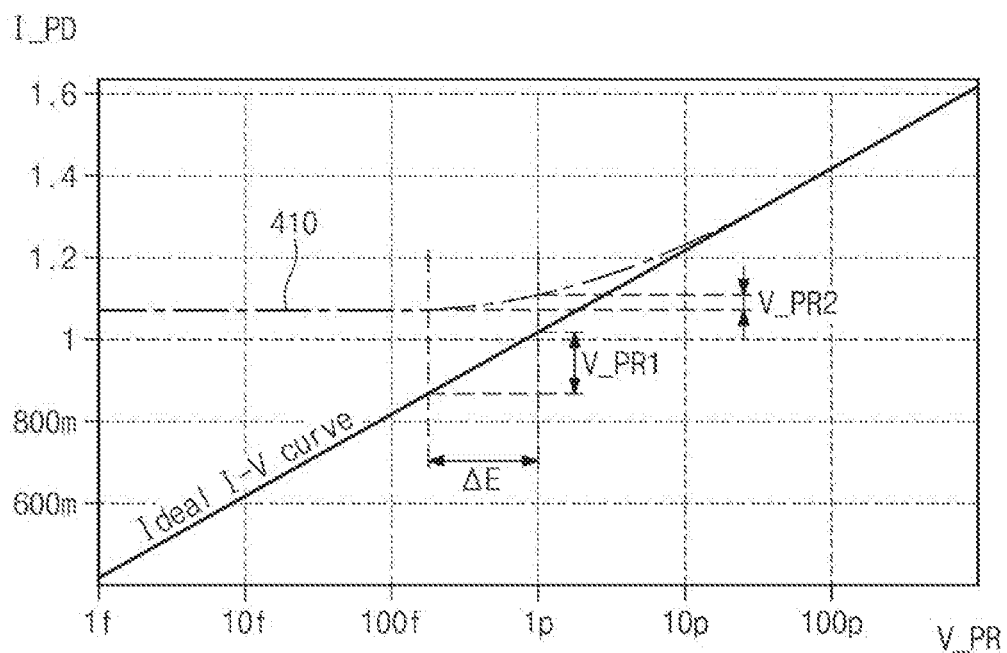
FIG. 4 is a graph for describing influence of the dark current in a high temperature, according to an exemplary embodiment.

FIG. 4 is a graph for describing influence of a dark current in a high-temperature environment. In FIG. 4, an X-axis denotes a voltage V_PR, and a Y-axis denotes a sense current I_PD. The voltage V_PR and the sense current I_PD are described with reference to FIG. 3, and a description thereof is thus omitted.

Referring to an ideal I-V curve of FIG. 4, a potential difference V_PR1 may occur according to a variation ΔE in incident light. As described above, a magnitude of the dark current I_SAT may become larger as a temperature of a photo diode becomes higher. Referring to a curve 410 to which influence of the dark current I_SAT in a high-temperature environment is applied, since the magnitude of the dark current I_SAT becomes larger as a temperature increases, only a potential difference V_PR2 distorted according to the variation ΔE of the same light may occur. Accordingly, the performance of the event-based sensor 100 may decrease due to noise that is based on the dark current I_SAT in the high-temperature environment.

The event-based sensor 100 according to an exemplary embodiment of the inventive concept may remove influence of the dark current I_SAT by using a dummy pixel. Returning to FIG. 1, the pixel array 120 may include a dummy pixel 122. Light provided to the dummy pixel 122 may be blocked, and the dummy pixel 122 may generate a current (i.e., a dark current) in a light-free environment. The event-based sensor 100 may remove a saturation component corresponding to a dark current I_SAT from a sense current I_PD by using the current generated at the dummy pixel 122.

In more detail, the event-based sensor 100 may mirror a current I_D flowing to the dummy pixel 122 by using a current mirror, and subtract a saturation component corresponding to the dark current I_SAT from the sense current I_PD flowing to the sensing pixel 121 by using the mirrored current. Assuming that a photo diode of the sensing pixel 121 and a photo diode of the dummy pixel 122 generate the sense current I_PD and the current I_D, respectively, in the same condition, the magnitude of the dark current I_SAT included in the sense current I_PD may be the same as the current I_D. Here, the condition may include a temperature, a p-n junction, a doping concentration, etc. Accordingly, the sensing pixel 121 may output an activation signal by using a current I_PHOTO that is obtained by subtracting the dark current I_SAT from the sense current I_PD. In this case, since influence of the dark current I_SAT is removed upon determining whether to output the activation signal, the sensing performance of the event-based sensor 100 in a low-illuminance or high-temperature environment may be improved.

According to an exemplary embodiment, one or more dummy pixels may be variously disposed, and the number of dummy pixels may be variously adjusted. For example, the dummy pixels may be disposed at an outer portion of the pixel array 120, may be disposed at the center of the pixel array 120, or may be disposed in parallel with sensing pixels at a periphery of the sensing pixels corresponding to the dummy pixels. The number of dummy pixels may be the same as the number of sensing pixels or may be more or less than the number of sensing pixels.

The number of dummy pixels or the number of sensing pixels may be adjusted such that the dark current I_SAT is removed from the sense current I_PD, which will be described in detail below. The event-based sensor 100 may have a structure for blocking light to be provided to the dummy pixel 122. The sensing pixels may be disposed at a portion of the pixel array 120, which is exposed to light, and the dummy pixels may be disposed at a portion of the pixel array 120, which is not exposed to light (i.e., at which light is blocked). For example, to block light to be provided to the dummy pixels, a metal shielding layer or the like may be stacked on or over the dummy pixels.

In an exemplary embodiment, a structure of each dummy pixel may be similar to that of each sensing pixel. That is, the dummy pixels may be used as the sensing pixels based on an operating mode of the event-based sensor 100. Alternatively, the sensing pixels may be used as the dummy pixels based on an operating mode of the event-based sensor 100.

Figure 5:
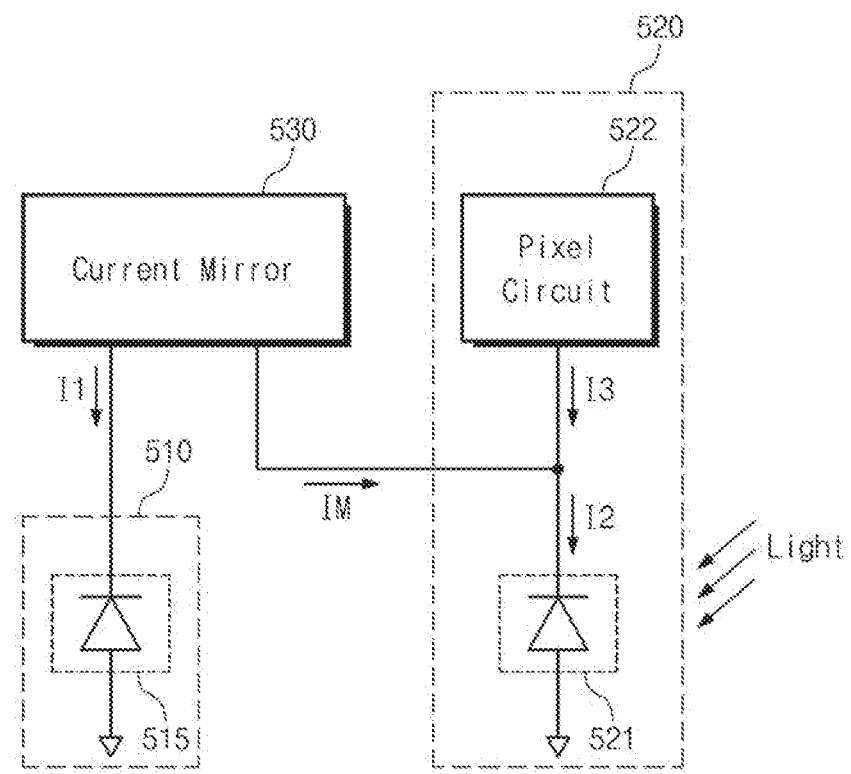
FIG. 5 is a diagram illustrating a sensing pixel, a dummy pixel, and a current mirror, according to an exemplary embodiment.

FIG. 5 is a diagram illustrating a sensing pixel, a dummy pixel and a current mirror, according to an exemplary embodiment. For brevity of illustration and convenience of description, only some configurations of a dummy pixel or a sensing pixel are illustrated in FIG. 5. However, the inventive concept may not be limited thereto.

Referring to FIG. 5, a dummy pixel 510 includes a photo diode 515. The photo diode 515 may generate a current I1 (i.e., a dark current) in a light-free (or, no-light, dark, etc.) environment. A current mirror 530 may generate a mirrored current IM by mirroring the current I1 flowing to the dummy pixel 510 and may output the mirrored current IM to a sensing pixel 520. The sensing pixel 520 includes a photo diode 521 and a pixel circuit 522. Light is provided to the photo diode 521. The photo diode 521 may generate a current I2 based on incident light. A current I3 that corresponds to a difference between the current I2 and the current IM flows in the pixel circuit 522. In more detail, as described above, the current I2 generated by the photo diode 521 of the sensing pixel 520 may include a dark current and a light current. The light current may have a magnitude that is proportional to the intensity of light actually incident on the photo diode 521, and the dark current may act as noise. The mirrored current IM may include the dark current. Accordingly, since the current IM is subtracted from the current I2, the current I3 may include only the light current. This may mean that the dark current acting as noise is removed.

The pixel circuit 522 may include a current-voltage converter, a time-variant circuit, and an event determination circuit, which will be more fully described below. The current-voltage converter may convert the current I3 into a voltage V_PR, the time-variant circuit may amplify a variation in the voltage V_PR at a preset ratio, and the event determination circuit may compare the amplified variation with a threshold value, and output an activation signal based on the comparison result.

The current I2 includes the dark current I_SAT and the light current I_PHOTO generated according to light incident on the photo diode 521. If conditions (e.g., a temperature and a doping concentration) of the photo diode 510 are the same as conditions of the photo diode 521, the dark current I_SAT included in the current I2, the current I1, and the current IM may be the same as one another in magnitude. Accordingly, the current I3 may include the current I_PHOTO by removing the dark current I_SAT from the current I2, and the pixel circuit 522 may sense a variation in light by using the current I3 without influence of the dark current I_SAT even in a low-illuminance environment or high-temperature environment, and output the activation signal as the sensing result.

The current mirror 530 may be implemented in various manners for mirroring the current I1. Below, a configuration of the current mirror 530 will be described through some exemplary embodiments, but the configuration of the current mirror 530 is not limited thereto.

Figure 6:
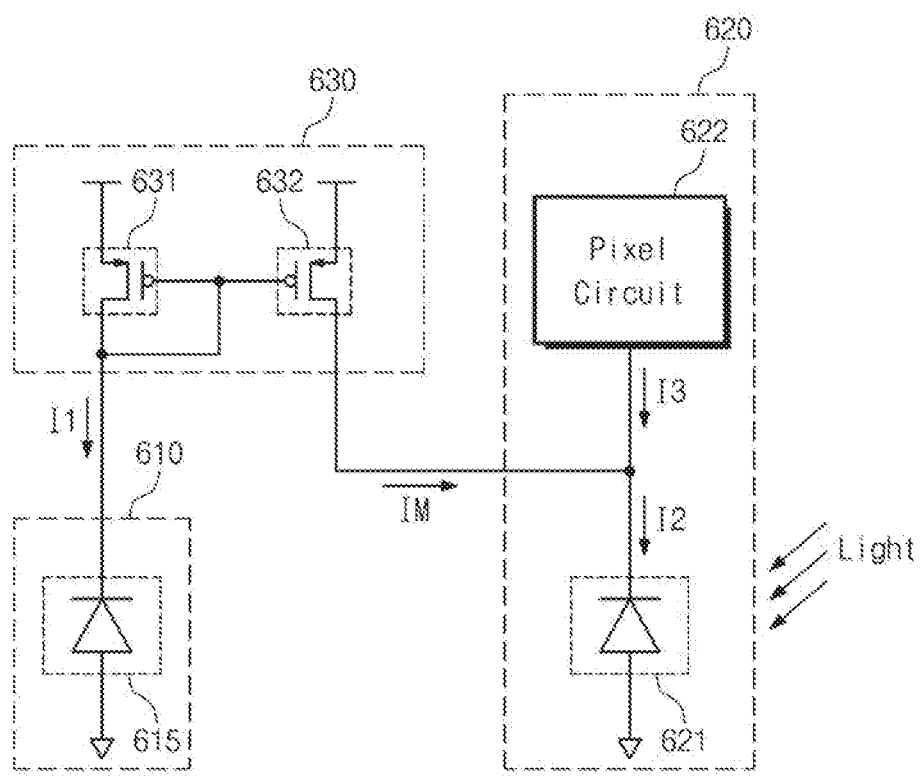
FIG. 6 is a diagram illustrating the current mirror of FIG. 5 in detail, according to an exemplary embodiment.

FIG. 6 is a diagram illustrating a configuration of a current mirror, according to an exemplary embodiment. Referring to FIG. 6, a current mirror 630 includes transistors 631 and 632.

A gate of the transistor 631, a drain of the transistor 631, and a gate of the transistor 632 are connected with a cathode of a photo diode 615. A drain of the transistor 632 is connected with a cathode of a photo diode 621. A power supply voltage is supplied to a source of the transistor 631 and a source of the transistor 632. Each of the transistors 631 and 632 may be a p-type metal-oxide-semiconductor (PMOS) transistor. However, the inventive concept is not limited thereto. The photo diode 615 of a dummy pixel 610 generates a current I1 in a light-free environment. The current mirror 630 may output a mirrored current IM (i.e., a replica current) to the drain of the transistor 632 through a replica of the current I1 flowing to the dummy pixel 610. A sensing pixel 620 includes the photo diode 621 and a pixel circuit 622. The drain of the transistor 632 may be connected with a node between the pixel circuit 622 and the photo diode 621.

Figure 7:
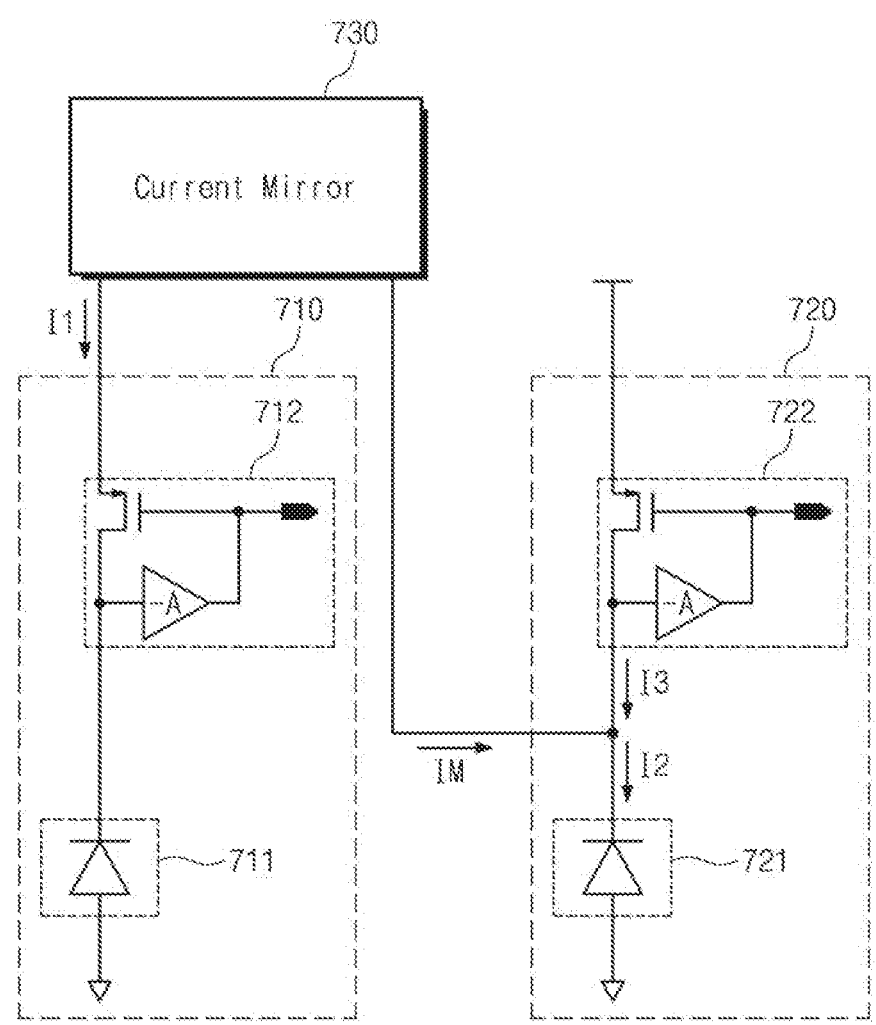
FIG. 7 is a diagram illustrating a configuration of the dummy pixel, the sensing pixel, and the current mirror, according to an exemplary embodiment.

FIG. 7 is a diagram illustrating a configuration of a dummy pixel and a sensing pixel, according to an exemplary embodiment. Referring to FIG. 7, a sensing pixel 720 includes a photo diode 721 and a current-voltage converter 722. The current-voltage converter 722 may be a circuit that is included in a pixel circuit of the sensing pixel 720. A dummy pixel 710 includes a photo diode 711 and a current-voltage converter 712.

In an actual environment, due to various factors, a magnitude of a current I1 may be different from a magnitude of a dark current I_SAT included in a current I2. For example, in a case where the dummy pixel 710 does not include the current-voltage converter 712 and the sensing pixel 720 includes the current-voltage converter 722, a magnitude of the dark current I_SAT and a magnitude of the current I1 may vary due to the current-voltage converter 722. Since the dummy pixel 710 according to an exemplary embodiment includes the current-voltage converter 712, the dummy pixel 710 may operate in the same condition and environment as the sensing pixel 720 except that light is incident on the sensing pixel 720.

In more detail, the photo diode 711 may generates the current I1, and the current-voltage converter 712 may convert the current I1 into a voltage. Here, the current-voltage converter 712 may be a dummy circuit that allows the dummy pixel 710 to operate in the same condition and environment as the sensing pixel 720, and an output voltage of the current-voltage converter 712 may not be used separately by an event-based sensor. A current mirror 730 may mirror the current I1 to output the current IM. The photo diode 721 may generates a current I2, and a current I3 may flow in the current-voltage converter 722. The current-voltage converter 722 may convert the current I3 into a voltage. Each of the current-voltage converters 712 and 722 may include a transistor and an amplifier. The transistor included in each of the current-voltage converters 712 and 722 may be an n-type metal-oxide-semiconductor (NMOS) transistor. The pixel circuit of the sensing pixel 720 may further include a time-variant circuit and an event determination circuit in addition to the current-voltage converter 722. However, for convenience of description, only the current-voltage converter 722, in which the current I2 flows, from among a plurality of circuits included in the pixel circuit is illustrated in FIG. 7.

Figure 8:
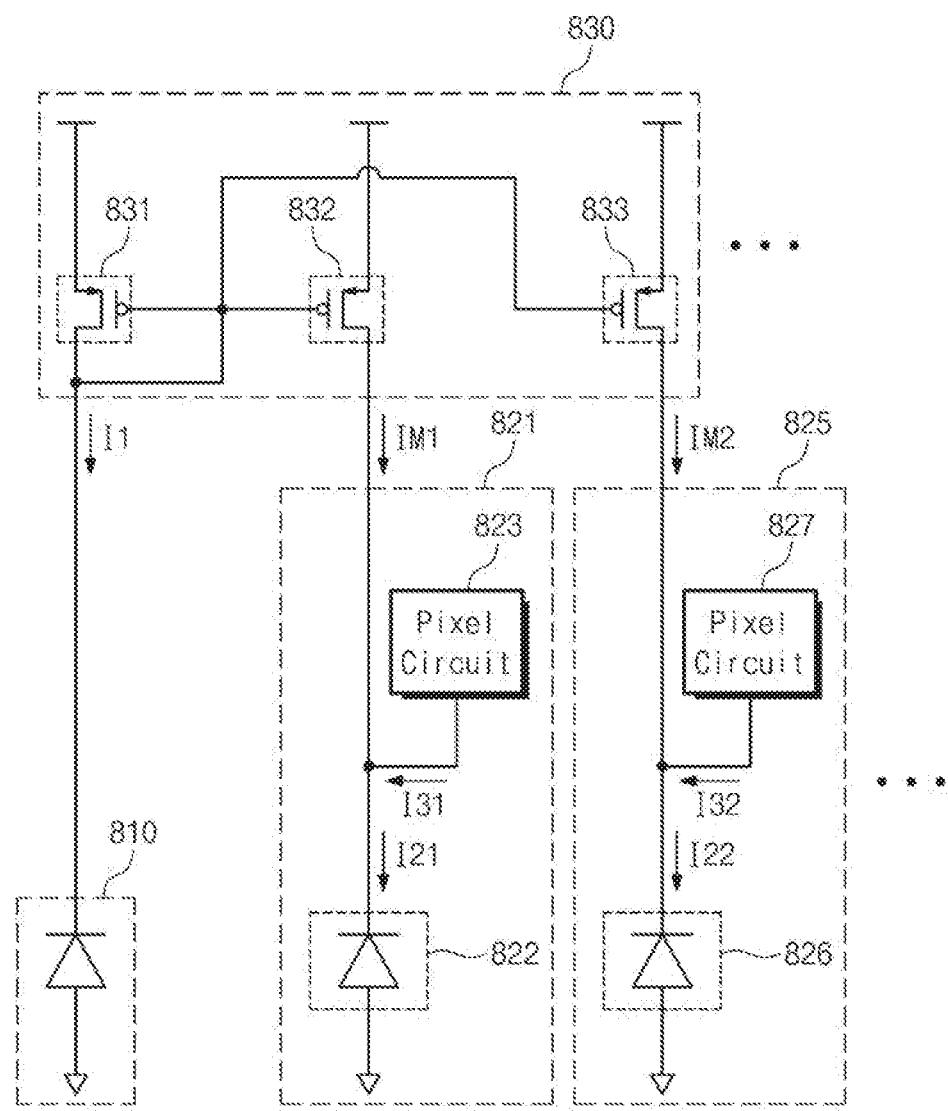
FIG. 8 is a diagram illustrating a configuration of the dummy pixel, the sensing pixel, and the current mirror, according to an exemplary embodiment.

FIG. 8 is a diagram illustrating a configuration of pixels, according to an exemplary embodiment. Referring to FIG. 8, a current mirror 830 includes transistors 831, 832 and 833.

A gate of the transistor 831, a drain of the transistor 831, a gate of the transistor 832, and a gate of the transistor 833 are connected with one another. The current mirror 830 may generate a mirrored current IM1 and a mirrored current IM2 based on the current I1 flowing to a dummy pixel 810. The current I1, the mirrored current IM1, and the mirrored current IM2 may substantially be the same as one another in amount. The mirrored current IM1 may be output to a sensing pixel 821, and the mirrored current IM2 may be output to a sensing pixel 825. For convenience of description, the dummy pixel 810 is illustrated as including only a photo diode. However, as described with reference to FIG. 7, the dummy pixel 810 may further include a current-voltage converter.

A photo diode 822 generates a current I21 based on light incident on the photo diode 822. A pixel circuit 823 may output a first activation signal based on a current I31 that is obtained by subtracting the mirrored current IM1 from the current I21. Also, a photo diode 826 generates a current I22 based on light incident on the photo diode 826. A pixel circuit 827 may output a second activation signal based on a current I32 that is obtained by subtracting the mirrored current IM2 from the current I22. According to the exemplary embodiment of FIG. 8, a pixel array may include dummy pixels the number of which is less than the number of sensing pixels.

Figure 9:
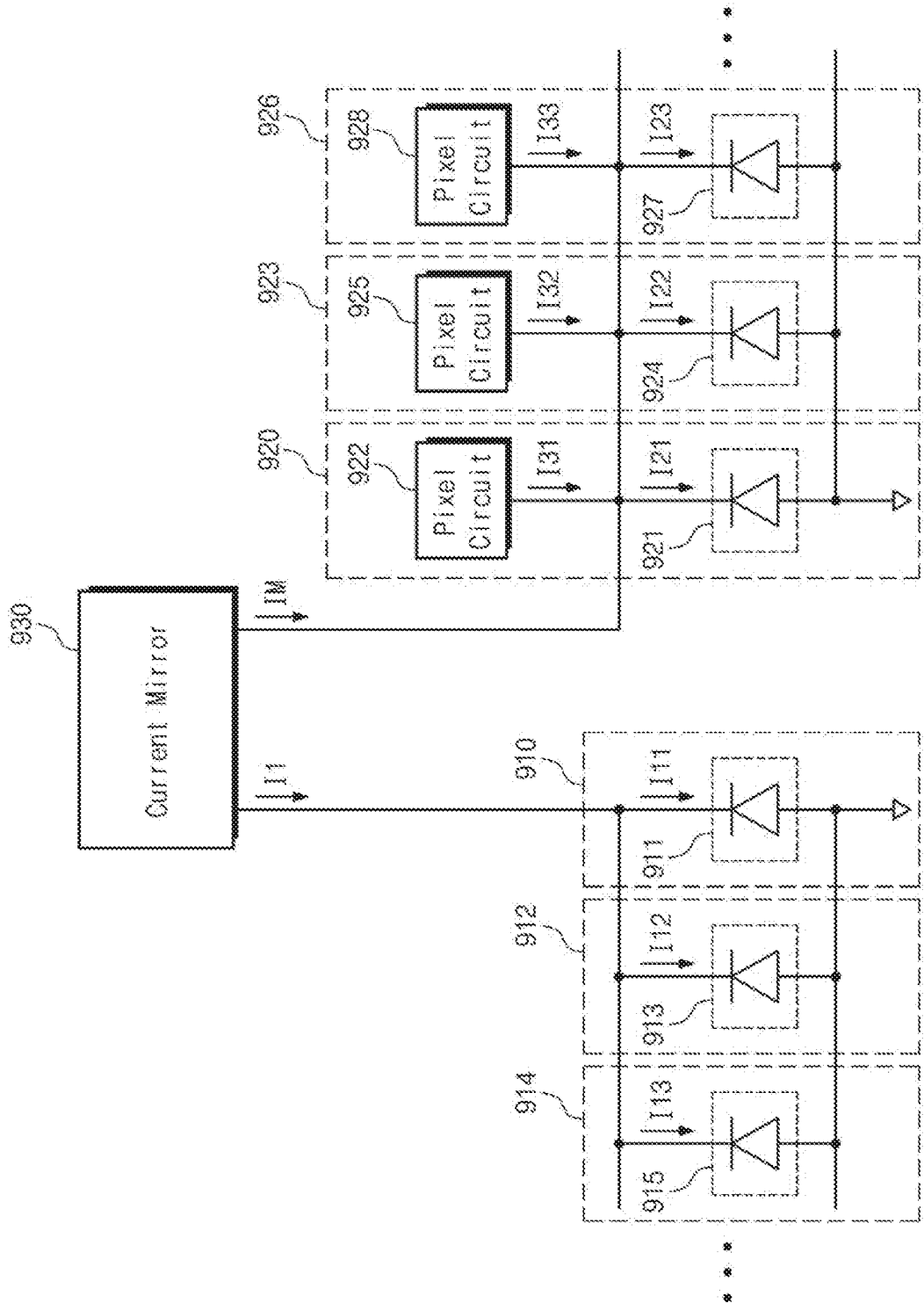
FIG. 9 is a diagram illustrating a configuration of dummy pixels, sensing pixels, and the current mirror, according to an exemplary embodiment.

FIG. 9 is a diagram illustrating a configuration of pixels, according to another exemplary embodiment. Referring to FIG. 9, dummy pixels 910, 912 and 914 and sensing pixels 920, 923 and 926 are illustrated.

A photo diode 911 generates a current I11, the photo diode 913 generates a current I12, and a photo diode 915 generates a current I13. For convenience of description, each of the dummy pixels 910, 912 and 914 is illustrated as including only a photo diode. However, as described with reference to FIG. 7, each of the dummy pixels 910, 912 and 914 may further include a current-voltage converter.

The current mirror 930 outputs the mirrored current IM, which is based on the current I1 corresponding to a sum of the current I11, the current I12, and the current I13, to the sensing pixels 920, 923, and 926. The mirrored current IM may be divided into the sensing pixels 920, 923 and 926 based on impedance of the sensing pixels 920, 923, and 926.

A photo diode 921 generates a current I21, a photo diode 924 generates a current I22, and a photo diode 927 generates a current I23. A pixel circuit 922 may output a first activation signal based on a current I31 obtained by subtracting a current, which corresponds to a part of the mirrored current IM divided into the sensing pixel 920, from the current I21. Also, a pixel circuit 925 may output a second activation signal based on a current I32 obtained by subtracting a current, which corresponds to a part of the mirrored current IM divided into the sensing pixel 923, from the current I22, and a pixel circuit 928 may output a third activation signal based on a current I33 obtained by subtracting a current, which corresponds to a part of the mirrored current IM divided into the sensing pixel 926, from the current I23.

As described above, in an actual environment, a magnitude of a current I_D generated in a photo diode of a dummy pixel and a magnitude of a dark current I_SAT included in a current generated in a photo diode of a sensing pixel may be different from each other due to various factors. In this case, the magnitude of the current I1 and a magnitude of a sum of the dark currents I_SAT may become the same by adjusting at least one of the number of dummy pixels and the number of sensing pixels. For example, in a case where "m" dummy pixels and "n" sensing pixels are connected with one current mirror, at least one of "m" and "n" may be adjusted such that a sum of dark currents of the "n" sensing pixels is the same as a sum of currents flowing in the "m" dummy pixels. Here, each of "m" and "n" may be an integer of 1 or more.

In FIG. 9, in a case where each of the currents I21, I22 and I23 includes a dark current I_SAT, the number of dummy pixels may be adjusted such that the magnitude of the current I1 is the same as the magnitude of a sum of the dark currents I_SAT. In this case, the magnitude of the dark current I_SAT may be determined based on dark currents measured in a light-free environment.

Figure 10:
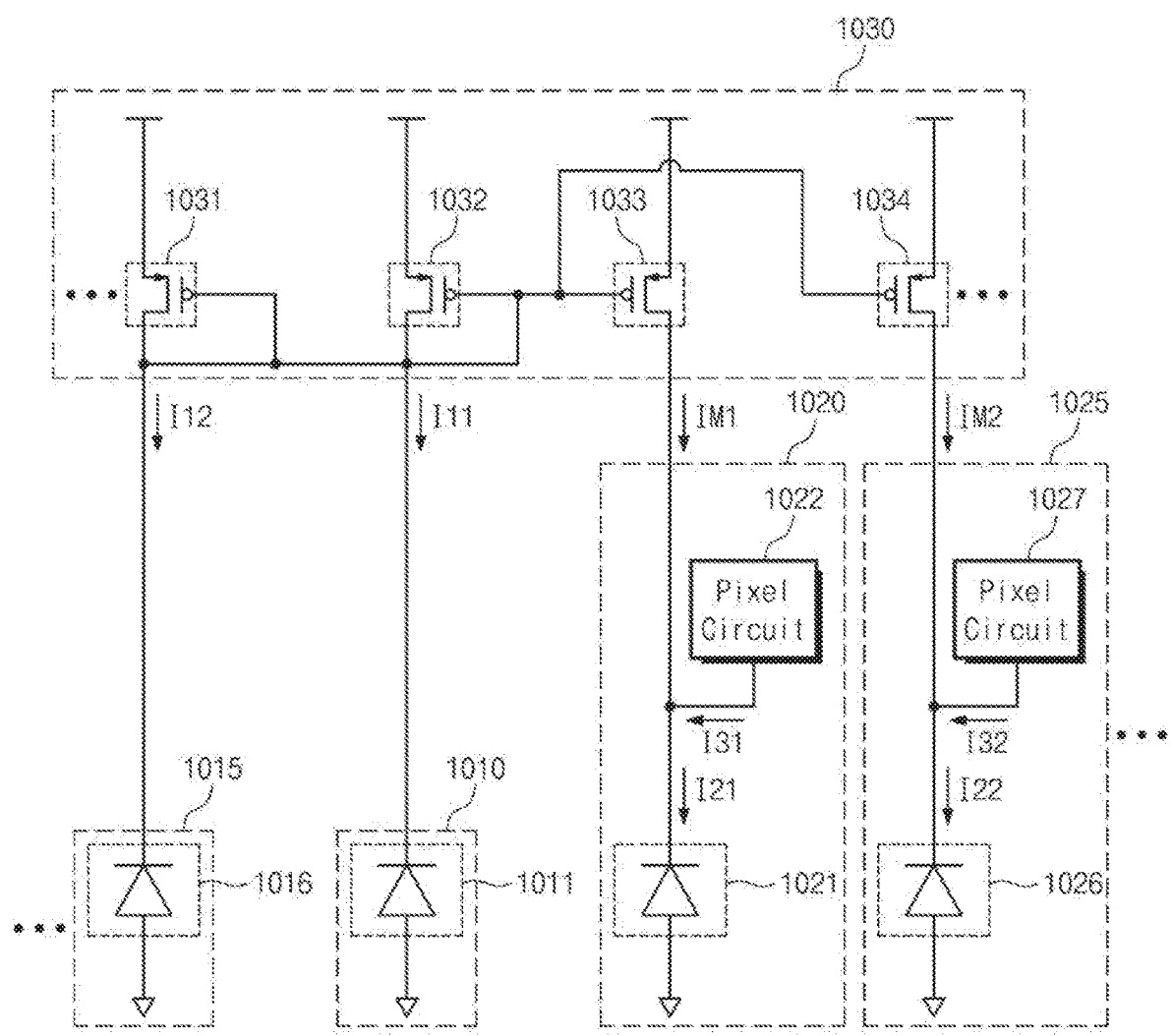
FIG. 10 is a diagram illustrating a configuration of the current mirror, according to an exemplary embodiment.

FIG. 10 is a diagram illustrating a configuration of a current mirror, according to another exemplary embodiment. Referring to FIG. 10, a current mirror 1030 includes transistors 1031, 1032, 1033 and 1034.

A dummy pixel 1010 includes a photo diode 1011, and a dummy pixel 1015 includes a photo diode 1016. The photo diode 1011 generates a current I11, and the photo diode 1016 generates a current I12. For convenience of description, each of the dummy pixels 1010 and 1015 is illustrated as including only a photo diode. However, as described with reference to FIG. 7, each of the dummy pixels 1010 and 1015 may further include a current-voltage converter.

A gate of the transistor 1031, a drain of the transistor 1031, a gate of the transistor 1032, a drain of the transistor 1032, a gate of the transistor 1033, and a gate of the transistor 1034 are connected with one another. Since the gates of transistors 1031 and 1032 are connected to each other, the current mirror 1030 may mirror a current of an amount corresponding to an average of the current I12 and the current I11. Influence of an error capable of being generated for each dummy pixel may be reduced by mirroring a current of an amount corresponding to an average of a plurality of dummy pixels. According to an exemplary embodiment, in a case where dummy pixels in an event-based sensor are not used for another purpose, all the dummy pixels may be used for current mirroring.

The current mirror 1030 generates a mirrored current IM1 and a mirrored current IM2. Here, each of the mirrored current IM1 and the mirrored current IM2 may be a current of an amount corresponding to an average of the current I11 and the current I12. The current mirror 1030 outputs the mirrored current IM1 to the sensing pixel 1020, and output the mirrored current IM2 to the sensing pixel 1025.

Since the operation of the sensing pixels 821 and 825 described with reference to FIG. 8 is applied to the sensing pixels 1020 and 1025, a description thereof is omitted. For various exemplifications, an exemplary embodiment is described as the current mirror 1030 generates the plurality of mirrored currents IM1 and IM2 for the plurality of sensing pixels 1020 and 1025. However, the current mirror 1030 may have a circuit structure in which only a single mirrored current is generated for a single sensing pixel.

Figure 11:
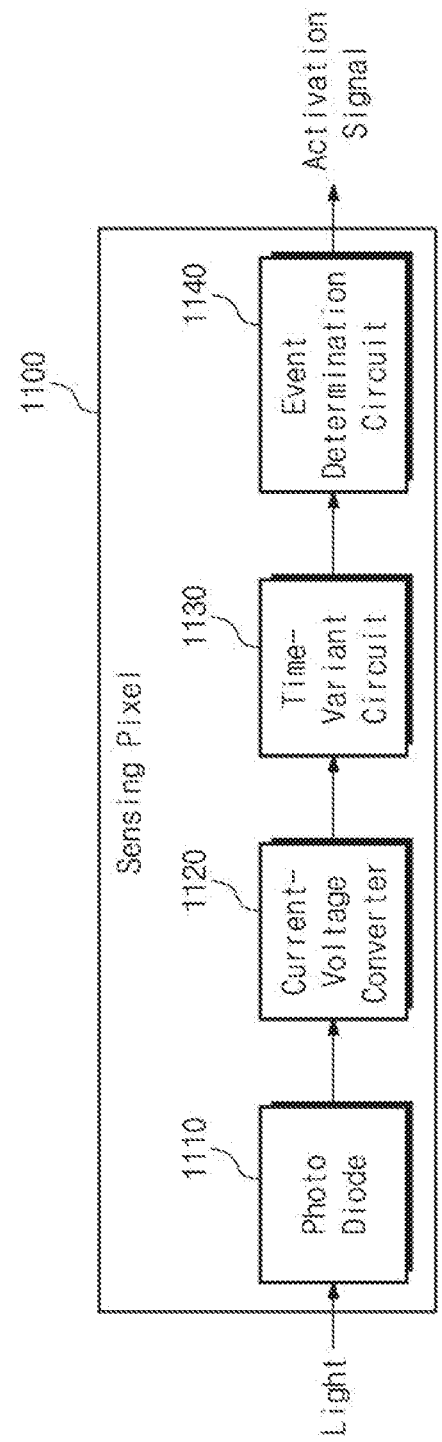
FIG. 11 is a block diagram illustrating the sensing pixel, according to an exemplary embodiment.

FIG. 11 is a block diagram illustrating a sensing pixel, according to an exemplary embodiment. Referring to FIG. 11, a sensing pixel 1100 includes a photo diode 1110, a current-voltage converter 1120, a time-variant circuit 1130, and an event determination circuit 1140.

The photo diode 1110 generates a sense current I_PD based on light incident on the photo diode 1110. The sense current I_PD may include a dark current I_SAT and a current I_PHOTO generated according to light incident on the photo diode 1110. According to an exemplary embodiment, the dark current I_SAT may be removed from the sense current I_PD.

The current-voltage converter 1120 may convert the sense current I_PD, which does not include the dark current (I_SAT), into a voltage V_PR. The current-voltage converter 1120 may include a transistor and an amplifier. The voltage V_PR may be generated as a current flows to the transistor in response to the sense current I_PD. In this case, the amount of current flowing to the transistor may not be linearly proportional to the intensity of sensed light. The amplifier may amplify the sense current I_PD in a log scale such that a magnitude of the voltage V_PR is linearly proportional to the intensity of light sensed by the photo diode 1110.

The time-variant circuit 1130 may amplify a variation in the voltage V_PR at a preset ratio. The time-variant circuit 1130 may be referred to as an "amplifier". The time-variant circuit 1130 may amplify a variation in the voltage V_PR to generate a voltage V_C. For example, the time-variant circuit 1130 may include capacitors and an amplifier. The first capacitor may be connected in series with the amplifier. The first capacitor may charge charges as the voltage V_PR varies. The amplifier may amplify a voltage generated by the charges charged in the first capacitor at a preset ratio. The time-variant circuit 1130 may further include the second capacitor that is a feedback capacitor of the amplifier. An amplification factor of the amplifier may be determined according to a capacitance ratio of the first and second capacitors. The charges charged in the first capacitor may be reset periodically or at a necessary time point. The first capacitor may be reset on the basis of the voltage V_PR during a reset operation.

The event determination circuit 1140 may compare the voltage V_C with a threshold value, and output an activation signal based on the comparison result. The event determination circuit 1140 may include a comparator that compares the voltage V_C with the threshold value. The comparator may compare the voltage V_C with a reference signal corresponding to the threshold value, and output the activation signal when the voltage V_C is larger than a voltage of the reference signal.

Figure 12:
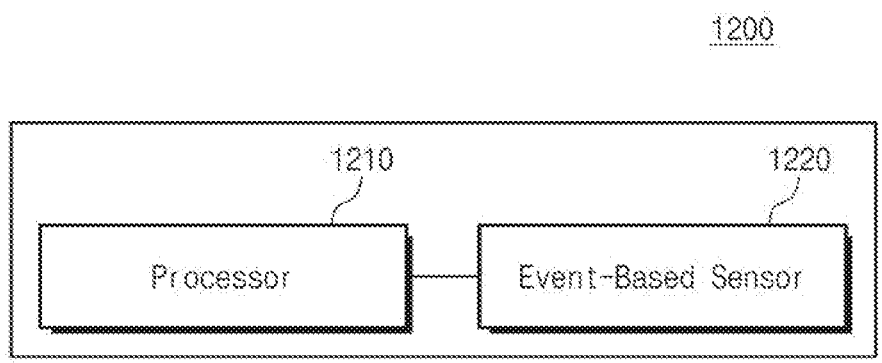
FIG. 12 is a block diagram illustrating an electronic device, according to an exemplary embodiment.

FIG. 12 is a block diagram illustrating an electronic device, according to an exemplary embodiment. Referring to FIG. 12, an electronic device 1200 includes a processor 1210 and an event-based sensor 1220.

The event-based sensor 1220 generates a current I_D in a light-free environment, generates a sense current I_PD based on incident light, and outputs an event signal by sensing a variation in the incident light based on a current that is obtained by subtracting a mirrored current of the current I_D from the sense current I_PD. The processor 1210 performs an operation corresponding to the variation in the incident light based on the event signal. The processor 1210 recognizes a user input corresponding to the variation in the incident light based on the event signal. The processor 1210 may generate a time stamp map based on a time stamp included in the event signal, and update the time stamp map in response to receiving the event signal. The processor 1210 may recognize the user input through the time stamp map.

The user input may include a gesture. For example, in a case where the user gestures by using a hand, the processor 1210, on the basis of the event signal, may recognize a direction in which the hand moves, a change in the direction in which the hand moves, a hand-moving distance, the number of unfolded fingers, etc. The processor 1210 may perform a specified operation corresponding to the recognized user input. For example, in a case where a palm of the user moves in a first direction, the processor 1210 may switch a page displayed on a display into a previous page; in a case where a palm of the user moves in a second direction, the processor 1210 may switch a page displayed on a display into a next page. Also, in a case where the user moves a hand upwards and downwards with one finger unfolded, the processor 1210 may scroll a page displayed on a display upwards and downwards.

Figure 13:
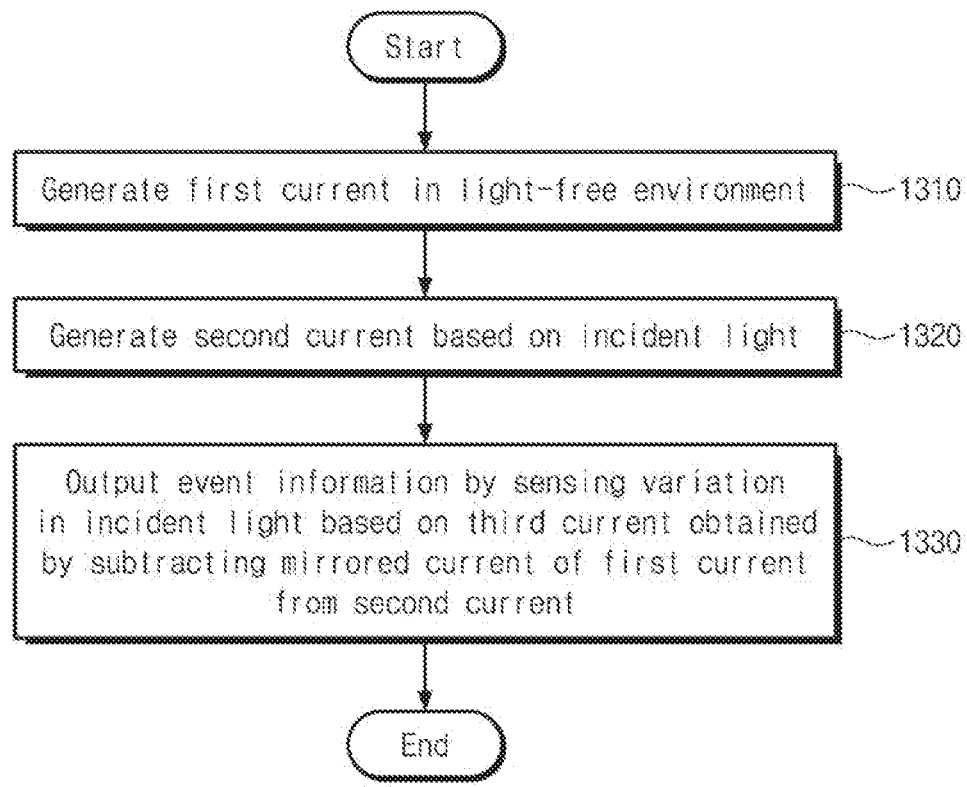
FIG. 13 is a flowchart illustrating an event-based sensing method, according to an exemplary embodiment.

FIG. 13 is a flowchart illustrating an event-based sensing method, according to an exemplary embodiment. An operation flowchart of FIG. 13 may be performed by an even-based sensing device. The event-based sensing device may include modules that perform substantially the same function as circuits included in an event-based sensor according to the above-described exemplary embodiments. The modules included in the event-based sensing device may be implemented with at least one hardware module, at least one software module, or various combinations thereof.

Referring to FIG. 13, in operation 1310, the event-based sensing device generates a first current in a light-free (or, no-light, dark, etc.) environment. In operation 1320, the event-based sensing device generates a second current based on incident light. The incident light may be light that varies according to a user input. In operation 1330, the event-based sensing device may generate a mirrored current by mirroring the first current and may sense a variation in light based on a third current that is obtained by subtracting the mirrored current of the first current from the second current. The event-based sensing device may generate event information associated with the user input by sensing the variation in light. Besides, the above description may be applied to the event-based sensing method, and a more detailed description is omitted.

Figure 14:
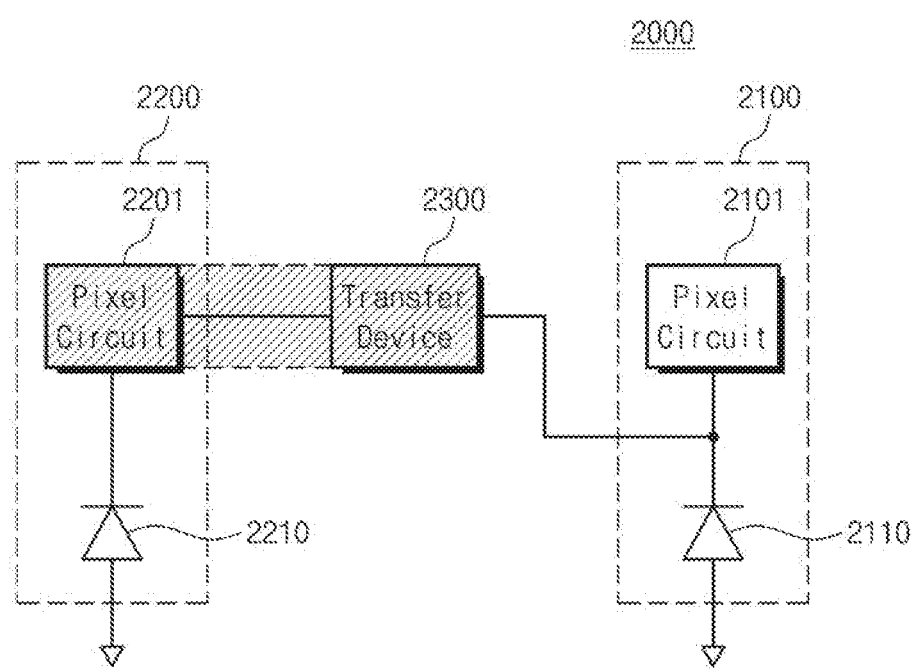
FIG. 14 is a diagram illustrating a configuration of the dummy pixel and the sensing pixel, according to an exemplary embodiment.

FIG. 14 is a diagram illustrating a configuration of a dummy pixel and a sensing pixel, according to an exemplary embodiment. Referring to FIG. 14, a pixel array 2000 may include a sensing pixel 2100, a dummy pixel 2200, and a transfer device 2300. For brevity of illustration, one dummy pixel and one sensing pixel are illustrated in FIG. 14. However, the inventive concept may not be limited thereto. For example, the pixel array 2000 may further include a plurality of dummy pixels and a plurality of sensing pixels. Also, as described above, it may be possible to generate a mirrored current based on an average value of dark currents from a plurality of dummy pixels, and remove the dark current from each of the plurality of sensing pixels based on the mirrored current.

The sensing pixel 2100 may include a pixel circuit 2101 and a photo diode 2110. The dummy pixel 2200 may include a pixel circuit 2201 and a photo diode 2210. Configurations of the sensing pixel 2100 and the dummy pixel 2200 are described above, and a detailed description is thus omitted.

In the above-described exemplary embodiments, a separate current mirror including at least two transistors is configured to replicate a dark current from a dummy pixel. However, in the exemplary embodiment of FIG. 14, a dark current from the dummy pixel 2200 may be replicated through the transfer device 2300 that is different from the above-described current mirror. In an exemplary embodiment, the transfer device 2300 may be implemented with one transistor.

For example, all or some of elements of the pixel circuit 2201 of the dummy pixel 2200 may constitute a current mirror through combination with the transfer device 2300. That is, the above-described current mirror may be configured to include a part of the pixel circuit 2201 and the transfer device 2300. Accordingly, the dark current I_SAT may be replicated by using some of elements of the dummy pixel 2200 as a current mirror without adding a separate current mirror. According to the above description, a configuration of an image sensing device may be simplified.

Figure 15:
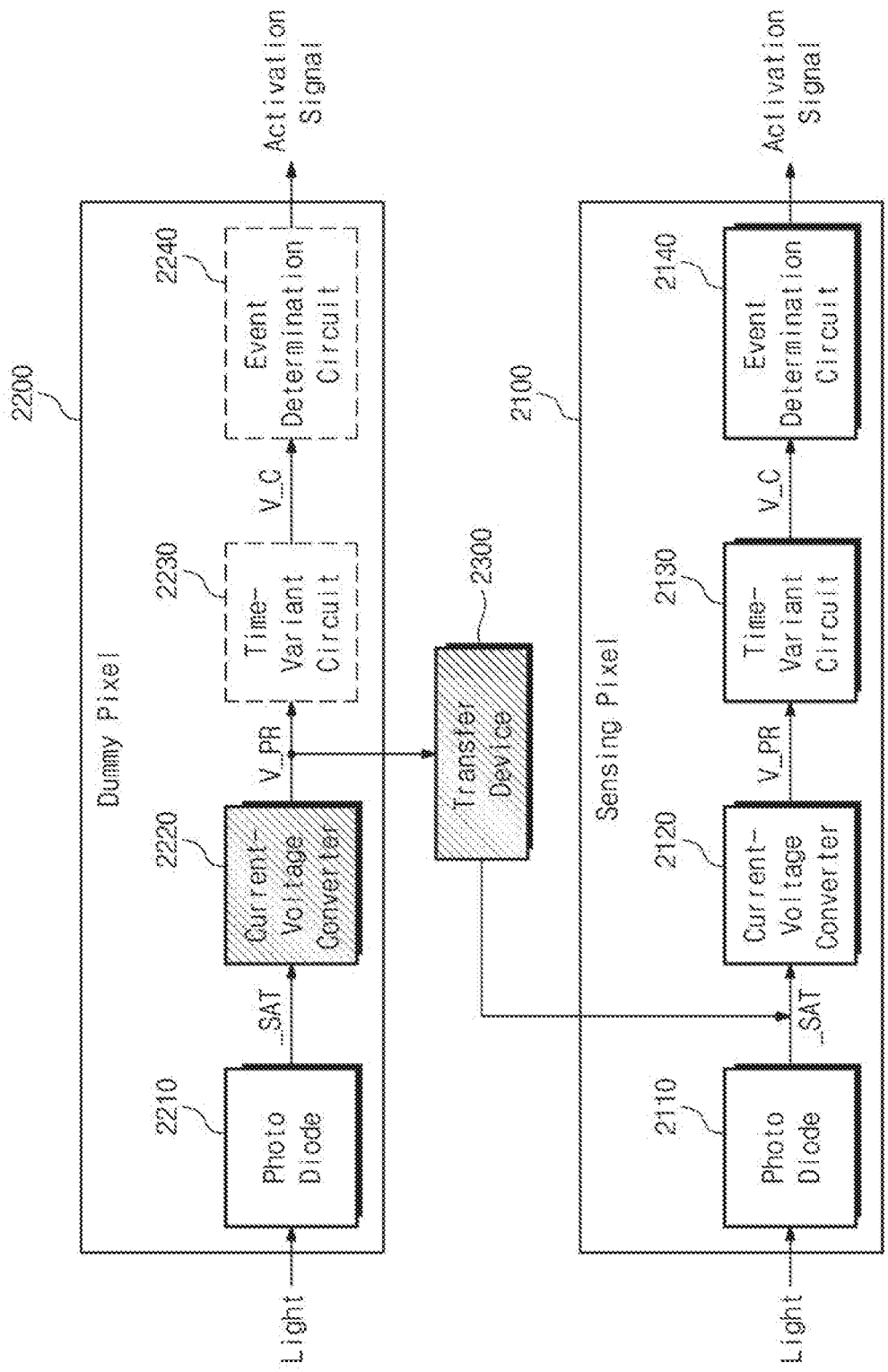
FIG. 15 is a block diagram illustrating a structure of the sensing pixel and the dummy pixel of FIG. 14, according to an exemplary embodiment.

FIG. 15 is a block diagram illustrating a structure of a sensing pixel and a dummy pixel of FIG. 14. For convenience of description, a detailed description associated with elements that are similar to the above-described elements is omitted.

Referring to FIGS. 14 and 15, the sensing pixel 2100 includes the photo diode 2110, a current-voltage converter 2120, a time-variant circuit 2130 and an event determination circuit 2140. The current-voltage converter 2120, the time-variant circuit 2130 and the event determination circuit 2140 of the sensing pixel 2100 may constitute the above-described pixel circuit 2101. Elements of the sensing pixel 2100 are described with reference to FIG. 11, and a detailed description thereof is thus omitted.

The dummy pixel 2200 includes the photo diode 2210, a current-voltage converter 2220, a time-variant circuit 2230 and an event determination circuit 2240. In an exemplary embodiment, the photo diode 2210, the current-voltage converter 2220, the time-variant circuit 2230 and the event determination circuit 2240 of the dummy pixel 2200 may be configured to have structures similar to or the same as those of the sensing pixel 2100 or perform functions similar to or the same as those of the sensing pixel 2100. The current-voltage converter 2220, the time-variant circuit 2230 and the event determination circuit 2240 of the dummy pixel 2200 may constitute the above-described pixel circuit 2201.

In an exemplary embodiment, above-described, the dummy pixel 2200 may be configured to generate a dark current I_SAT and to provide the generated dark current I_SAT to the outside (e.g., a current mirror). In this case, elements that are unnecessary to provide the dark current I_SAT to the outside may be omitted or may be deactivated.

For example, some (e.g., the current-voltage converter 2220, the time-variant circuit 2230, or the event determination circuit 2240) of elements of the dummy pixel 2200 may be omitted. That is, the dummy pixel 2200 may be configured to include the photo diode 2210 or to include the photo diode 2210 and the current-voltage converter 2220 among the elements 2210, 2220, 2230 and 2240.

Alternatively, the dummy pixel 2200 may include the photo diode 2210, the current-voltage converter 2220, the time-variant circuit 2230 and the event determination circuit 2240, and some of the elements 2210, 2220, 2230 and 2240 may be deactivated. For example, the current-voltage converter 2220, the time-variant circuit 2230 and the event determination circuit 2240 may be deactivated, or the time-variant circuit 2230 and the event determination circuit 2240 may be deactivated.

The exemplary embodiments described with reference to FIGS. 5 to 7 need a separate current mirror for mirroring the dark current I_SAT. In the exemplary embodiment of FIGS. 14 and 15, some of elements of the dummy pixel 2200 may be configured to be included in a current mirror.

For example, a voltage V_PR from the current-voltage converter 2220 may be provided to the transfer device 2300, and the transfer device 2300 may be configured to replicate the dark current I_SAT generated in the dummy pixel 2200 in response to the received voltage V_PR, and provide the replicated current IM to the sensing pixel 2100. In an exemplary embodiment, the transfer device 2300 may include one transistor. The transfer device 2300 may have a configuration different from the above-described current mirror or may include some of elements of the current mirror.

That is, some (e.g., the current-voltage converter 2220) of the elements of the dummy pixel 2200 and the transfer device 2300 may constitute a current mirror. Accordingly, the dark current I_SAT may be replicated by using some of the elements of the dummy pixel 2200 without adding a separate current mirror. According to the above description, a configuration of an image sensing device may be simplified.

Figure 16:
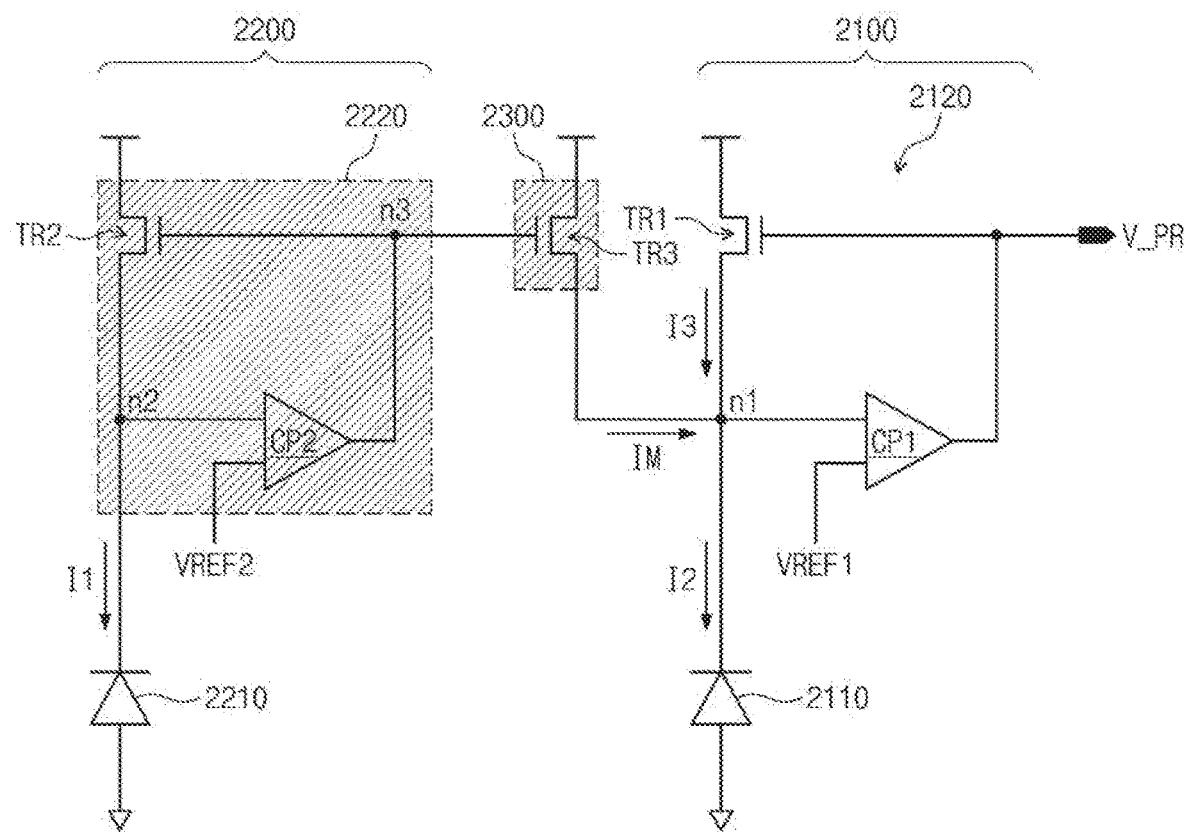
FIG. 16 is a circuit diagram illustrating a partial configuration of the sensing pixel and the dummy pixel of FIG. 15, according to an exemplary embodiment.

FIG. 16 is a circuit diagram illustrating a partial configuration of a sensing pixel and a dummy pixel of FIG. 15. For brevity of illustration and convenience of description, elements that are unnecessary to describe an exemplary embodiment of the inventive concept are omitted.

The sensing pixel 2100 may include the photo diode 2110 and the current-voltage converter 2120. A cathode of the photo diode 2110 is connected with a first node n1, and an anode thereof is connected with a ground terminal. The current-voltage converter 2120 may include a first transistor TR1 and a first comparator CP1. A source of the first transistor TR1 is connected with a power supply voltage, a gate thereof is connected with an output terminal of the first comparator CP1, and a drain thereof is connected with the first node n1. A first input terminal of the first comparator CP1 is connected with the first node n1, and a second input terminal thereof is connected to receive a first reference voltage VREF1. In an exemplary embodiment, an output terminal of the first comparator CP1 may be connected with the time-variant circuit 2130 of the sensing pixel 2100.

The dummy pixel 2200 may include the photo diode 2210 and the current-voltage converter 2220. A cathode of the photo diode 2210 is connected with a second node n2, and an anode thereof is connected with the ground terminal. The current-voltage converter 2220 may include a second transistor TR2 and a second comparator CP2. A source of the second transistor TR2 is connected to receive the power supply voltage, a gate thereof is connected with a third node n3, and a drain thereof is connected with the second node n2. A first input terminal of the second comparator CP2 is connected with the second node n2, a second input terminal thereof is connected to receive a second reference voltage VREF2, and an output terminal thereof is connected with the third node n3.

The transfer device 2300 may include a third transistor TR3. A source of the third transistor TR3 is connected to receive the power supply voltage, a drain thereof is connected with the first node n1, and a gate thereof is connected with the third node n3. Although the first to third transistors TR1, TR2 and TR3 in FIG. 16 are illustrated as n-type metal-oxide-semiconductor (NMOS) transistors, however, the inventive concept may not be limited thereto. The transistors according to the inventive concept may be modified to various types according to an implementation of the inventive concept.

A part (e.g., the current-voltage converter 2220) of the dummy pixel 2200 and the transfer device 2300 may constitute a current mirror. For example, the photo diode 2210 of the dummy pixel 2200 may generate a first current I1. In this case, the first current I1 may be a dark current. A part (e.g., the current-voltage converter 2220) of the dummy pixel 2200 and the transfer device 2300 may replicate the first current I1, and provide the mirrored (or replicated) current IM to the sensing pixel 2100. In an exemplary embodiment, the mirrored current IM may be provided to the first node n1 of the sensing pixel 2100.

Afterwards, an operation of the sensing pixel 2100 may be similar to an operation of removing a noise component due to the above-described dark current. For example, the photo diode 2110 of the sensing pixel 2100 may generate a second current I2 based on the intensity of incident light. In this case, the second current I2 may include a dark current and a light current. When the mirrored current IM of the first current (i.e., a dark current) I1 is provided to the first node n1 of the sensing pixel 2100, the current-voltage converter 2120 may output the voltage V_PR based on the third current I3. In an exemplary embodiment, the voltage V_PR may be provided to the time-variant circuit 2130.

As described above, according to some exemplary embodiments of the inventive concept, it may be possible to form a current mirror by using a part of a pixel circuit in a dummy pixel, and a noise component due to a dark current may be removed through the current mirror thus formed. That is, additional elements for constituting a current mirror may be simplified. Accordingly, an event-based sensor having improved reliability and reduced costs may be provided.

In an exemplary embodiment, the first reference voltage VREF1 provided to the sensing pixel 2100 and the second reference voltage VREF2 provided to the dummy pixel 2200 may be controlled independently of each other. For example, the first and second reference voltages VREF1 and VREF2 may be adjusted or set according to a process, voltage, and temperature (PVT) variation of the event-based sensor. Alternatively, the first and second reference voltages VREF1 and VREF2 may be controlled independently of each other, based on an operating environment in which the event-based sensor operates.

As a more detailed example, operating characteristics of the third transistor TR3 of the transfer device 2300 and the second transistor TR2 of the dummy pixel 2200, which constitute a current mirror, may be different from each other. In an ideal case (i.e., in a case where the operating characteristics of the second and third transistors TR2 and TR3 are the same), if the first and second reference voltages VREF1 and VREF2 are the same, magnitudes of the first current I1 and the mirrored current IM may be the same.

However, the operating characteristics of the second and third transistors TR2 and TR3 may be different from each other due to a process-voltage-temperature (PVT) variation occurring in a process of manufacturing the event-based sensor or due to a change in an operating environment. In this case, if the first and second reference voltages VREF1 and VREF2 are the same, magnitudes of the first current I1 and the mirrored current IM may be different from each other. This may mean that a noise component is not completely removed from the sensing pixel 2100.

The event-based sensor according to an exemplary embodiment of the inventive concept may make the magnitudes of the first current I1 and the mirrored current IM identical, by independently controlling the first reference voltage VREF1 provided to the sensing pixel 2100 and the second reference voltage VREF2 provided to the dummy pixel 2200.

As a more detailed example, the first comparator CP1 that receives the first reference voltage VREF1 may be configured to maintain a voltage of the first node n1 with the first reference voltage VREF1. The second comparator CP2 that receives the second reference voltage VREF2 may be configured to maintain a voltage of the second node n2 with the second reference voltage VREF2. Due to different characteristics of the second and third transistors TR2 and TR3 (i.e., different characteristics due to a PVT variation or an operating environment), a magnitude of the mirrored current IM may be smaller than a magnitude of the first current I1. In this case, the magnitudes of the first current I1 and the mirrored current IM may be adjusted to be the same by increasing the second reference voltage VREF2 by a specific level or decreasing the first reference voltage VREF1 by a specific level. In contrast, in a case where the magnitude of the mirrored current IM is greater than the magnitude of the first current I1, the magnitudes of the first current I1 and the mirrored current IM may be adjusted to be the same by decreasing the second reference voltage VREF2 by a specific level or increasing the first reference voltage VREF1 by a specific level.

As described above, accuracy of the mirrored current IM may be improved by controlling the first and second reference voltages VREF1 and VREF2 provided to the sensing pixel 2100 and the mirrored pixel 2200.

Figure 17:
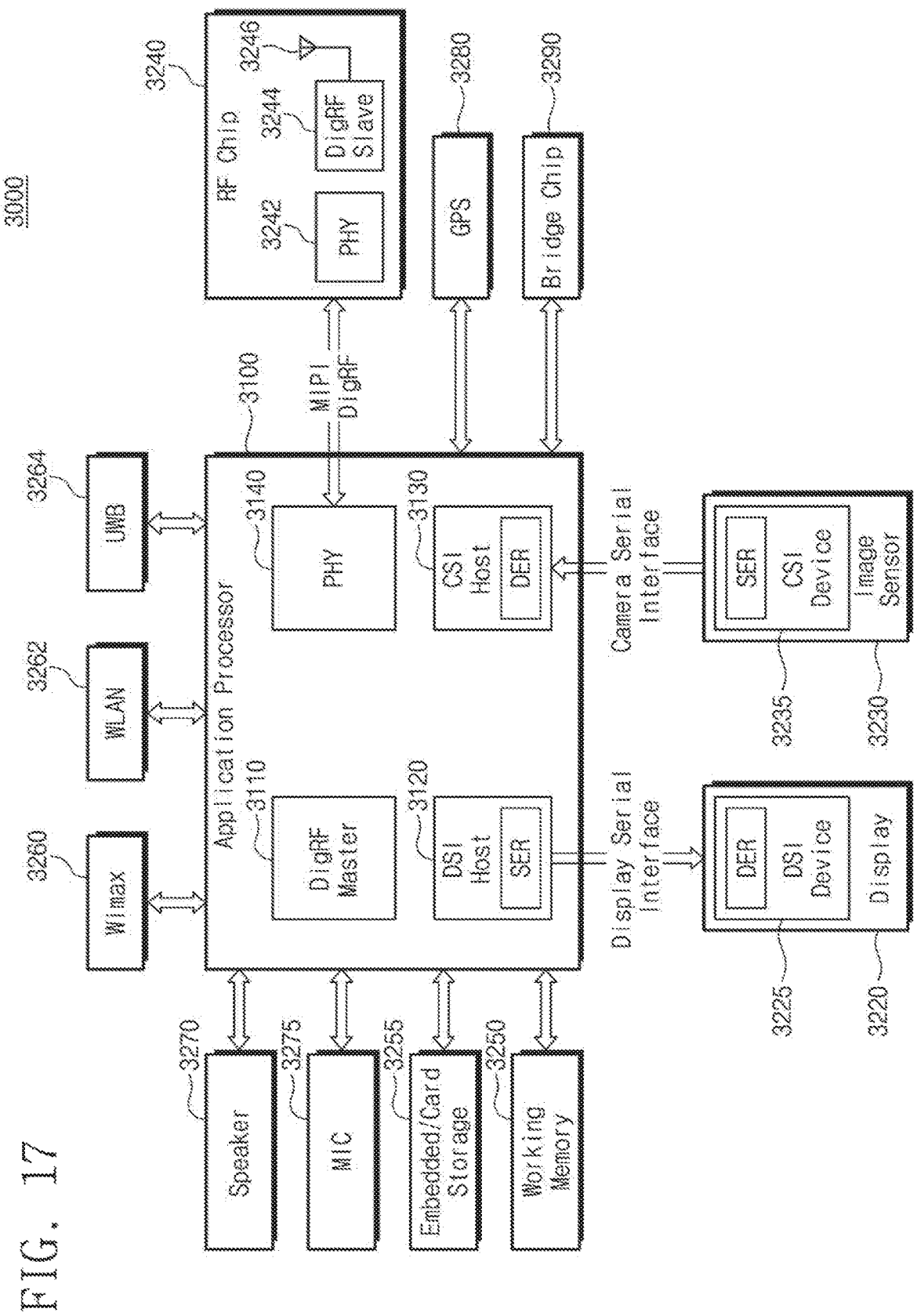
FIG. 17 illustrates an electronic system to which the event-based sensor according to the above exemplary embodiments is applied, according to an exemplary embodiment.

FIG. 17 is a block diagram illustrating an electronic system to which an event-based sensor according to the above exemplary embodiments of the inventive concept is applied, according to an exemplary embodiment. Referring to FIG. 17, an electronic system 3000 may be implemented with an electronic device such as a portable communication terminal, a personal digital assistant (PDA), a portable multimedia player (PMP), a smartphone, or a wearable device. Alternatively, the electronic system 3000 may be implemented with an image collection device, such as a black box, a digital camera, or a video camcorder, and may be applied to devices such as machines. In an exemplary embodiment, the term "machine" may be intended as comprehensively including a single machine, a virtual machine, or a system in which machines, virtual machines, or devices operating together are electrically connected. Example machines may include computing devices, such as a personal computer, a workstation, a server, a portable computer, a pocket-type computer, a telephone, and a tablet, and a personal or public transportation means, for example, transport devices, such as a vehicle, a train, and a taxi.

Also, the electronic system 3000 will be described with reference to FIG. 17. However, the inventive concept may not be limited thereto. For example, some elements may be omitted, or other elements may be added.

The electronic system 3000 may include an application processor 3100, a display 3220, and an image sensor 3230. In an exemplary embodiment, the image sensor 3230 may be the event-based sensor described with reference to FIGS. 1 to 16. The application processor 3100 may sense a movement of a user based on an activation signal from the image sensor 3230.

The application processor 3100 may include a DigRF master 3110, a display serial interface (DSI) host 2120, a camera serial interface (CSI) host 3130, and a physical layer 3140.

The DSI host 3120 may communicate with a DSI device 3225 of the display 3220 through the DSI. In an exemplary embodiment, an optical serializer SER may be implemented in the DSI host 3120. For example, an optical deserializer DES may be implemented in the DSI device 3225.

The CSI host 3130 may communicate with a CSI device 3235 of the image sensor 3230 through the CSI. In an exemplary embodiment, an optical deserializer DES may be implemented in the CSI host 3130. For example, an optical serializer SER may be implemented in the CSI device 3235.

The electronic system 3000 may further include a radio frequency (RF) chip 3240 for communicating with the application processor 3100. The RF chip 3240 may include a physical layer 3242, a DigRF slave 3244, and an antenna 3246. In an exemplary embodiment, the physical layer 3242 of the RF chip 3240 and the physical layer 3140 of the application processor 3100 may exchange data with each other through an MIPI DigRF interface.

The electronic system 3000 may further include a working memory 3250 and embedded/card storage 3255. The working memory 3250 and the embedded/card storage 3255 may store data received from the application processor 3100. The working memory 3250 and the embedded/card storage 3255 may provide the data stored therein to the application processor 3100.

The working memory 3250 may temporarily store data, which was processed or will be processed by the application processor 3100. The working memory 3250 may include a volatile memory, such as a static random access memory (SRAM), a dynamic RAM (DRAM), or a synchronous DRAM (SDRAM), or a nonvolatile memory, such as a flash memory, a phase change RAM (PRAM), a magnetic RAM (MRAM), a resistive RAM (ReRAM), or a ferroelectric RAM (FRAM).

The embedded/card storage 3255 may store data regardless of a power supply.

The electronic system 3000 may communicate with an external system through a communication module such as a worldwide interoperability for microwave access (WiMAX) 3260, a wireless local area network (WLAN) 3262, and an ultra-wideband (UWB) 3264, or the like.

The electronic system 3000 may further include a speaker 3270 and a microphone 3275 for processing voice information. The electronic system 3000 may further include a global positioning system (GPS) device 3280 for processing position information. The electronic system 3000 may further include a bridge chip 3290 for managing connections between peripheral devices.

The above-described exemplary embodiments may be implemented with hardware elements, software elements, and/or a combination of hardware elements and software elements. For example, the devices, methods, and elements described in the exemplary embodiments of the inventive concept may be implemented by using one or more general-use computers or special-purpose computers, such as a processor, a controller, an arithmetic logic unit (ALU), a digital signal processor, a microcomputer, a field programmable array (FPA), a programmable logic unit (PLU), a microprocessor, or any device which may execute instructions and respond. A processing unit may perform an operating system (OS) or one or software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing elements and/or a plurality of types of processing elements. For example, the processing unit may include a plurality of processors or one processor and one controller. Also, the processing unit may have a different processing configuration, such as a parallel processor.

Software may include computer programs, codes, instructions or one or more combinations thereof and configure a processing unit to operate in a desired manner or independently or collectively control the processing unit. Software and/or data may be permanently or temporarily embodied in any type of machine, components, physical equipment, virtual equipment, computer storage media or units or transmitted signal waves so as to be interpreted by the processing unit or to provide instructions or data to the processing unit. Software may be dispersed throughout computer systems connected via networks and be stored or executed in a dispersion manner. Software and data may be recorded in one or more computer-readable storage media.

The methods according to the above-described exemplary embodiments of the inventive concept may be recorded in a computer-readable medium including program instructions that are executable through various computer devices. The computer-readable medium may also include the program instructions, data files, data structures, or a combination thereof. The program instructions recorded in the medium may be designed and configured specially for the exemplary embodiments of the inventive concept or may be known and available to those skilled in computer software. The computer-readable medium may include hardware devices, which are specially configured to store and execute program instructions, such as magnetic media such as a hard disk, a floppy disk, and a magnetic tape, optical recording media (e.g., CD-ROM and DVD), magneto-optical media (e.g., a floptical disk), read only memories (ROMs), random access memories (RAMs), and flash memories. Examples of computer programs include not only machine language codes created by a compiler, but also high-level language codes that are capable of being executed by a computer by using an interpreter or the like. The described hardware devices may be configured to act as one or more software modules to perform the operations of the above-described exemplary embodiments of the inventive concept, or vice versa.

Even though the exemplary embodiments are described with reference to restricted drawings, it may be obvious to one skilled in the art that the exemplary embodiments are variously changed or modified based on the above description. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

According to an exemplary embodiment of the inventive concept, it may be possible to generate a dark current by using a dummy pixel, and remove a noise component (i.e., a noise component corresponding to a saturation component) corresponding to a dark current from a sensing pixel based on the generated dark current. Accordingly, an event-based sensor having improved reliability, an operating method thereof, and an electronic device including the same are provided.

While the inventive concept has been described with reference to exemplary embodiments, it will be apparent to those skilled in the art that various changes and modifications may be made without departing from the spirit and scope of the inventive concept. Therefore, it should be understood that the above exemplary embodiments are not limiting, but illustrative.

What is claimed is:

1. An image sensor device comprising:
   a first dummy pixel configured to generate a first dark current,
   a current mirror configured to mirror the first dark current to generate a mirrored current; and
   a first sensing pixel configured to output a first event signal based on a first light current, the first light current being based on the mirrored current and a first light incident on the first sensing pixel,
   wherein the first event signal is based on a variation of the first light,
   wherein the first sensing pixel outputs the first event signal without synchronization with a time,
   wherein the first sensing pixel comprises:
   a first node configured to receive the mirrored current;
   a first photodiode connected to the first node, the first photodiode configured to generate a first sense current based on the first light;
   a first current-voltage converter configured to receive the first light current, which is obtained by removing the mirrored current from the first sense current, and convert the first light current into a first voltage;
   a first time-variation circuit configured to amplify a variation of the first voltage to a first amplified voltage; and
   a first event determination circuit configured to compare the first amplified voltage with a threshold value, and output the first event signal based on a result of the comparison.

2. The image sensor device of claim 1, wherein the result of the comparison indicates that the first amplified voltage exceeds the threshold value, the first event determination circuit outputs the first event signal.

3. The image sensor device of claim 1, wherein the current mirror comprises:
   a first p-type metal-oxide-semiconductor (PMOS) transistor connected between a power supply voltage and the first dummy pixel, a gate of the first PMOS transistor connected to the first dummy pixel; and
   a second PMOS transistor connected between the power supply voltage and the first node, a gate of the second PMOS transistor connected to the gate of the first PMOS transistor.

4. The image sensor device of claim 1, wherein the first dummy pixel comprises:
   a dummy photodiode configured to generate the first dark current; and
   a dummy current-voltage converter connected between the dummy photodiode and the current mirror.

5. The image sensor device of claim 1, further comprises:
   a second sensing pixel configured to output a second event signal based on a second light current, the second light current being based on the mirrored current and a second light incident on the second sensing pixel, and,
   wherein the second event signal is based on a variation of the second light, and wherein the first sensing pixel and the second sensing pixel output the first event signal and the second event signal without the synchronization with the time, respectively.

6. The image sensor device of claim 5, wherein the second sensing pixel comprises:
a second node configured to receive the mirrored current;
a second photodiode connected to the second node, the second photodiode configured to generate a second sense current based on the second light;
a second current-voltage converter configured to receive the second light current, which is obtained by removing the mirrored current from the second sense current, and convert the second light current into a second voltage;
a second time-variation circuit configured to amplify a variation of the second voltage to a second amplified voltage; and
a second event determination circuit configured to compare the second amplified voltage with the threshold value, and output the second event signal based on a result of the comparison.

7. The image sensor device of claim 6, wherein the current mirror comprises:
a first p-type metal-oxide-semiconductor (PMOS) transistor connected between a power supply voltage and the first dummy pixel, a gate of the first PMOS transistor connected to the first dummy pixel;
a second PMOS transistor connected between the power supply voltage and the first node, a gate of the second PMOS transistor connected to the gate of the first PMOS transistor; and
a third PMOS transistor connected between the power supply voltage and the second node, a gate of the third PMOS transistor connected to the gate of the first PMOS transistor.

8. The image sensor device of claim 6, further comprises:
a second dummy pixel configured to generate a second dark current,
wherein the mirrored current comprises a first mirrored current and a second mirrored current,
wherein the current mirror is further configured to mirror a sum of the first dark current and the second dark current to generate the first mirrored current and the second mirrored current,
wherein the first mirrored current is provided to the first node, and
wherein the second mirrored current is provided to the second node.

9. The image sensor device of claim 8, wherein an amount of each of the first mirrored current and the second mirrored current corresponds to an average of the first dark current and the second dark current.

10. The image sensor device of claim 8, wherein the current mirror comprises:
a first p-type metal-oxide-semiconductor (PMOS) transistor connected between a power supply voltage and the first dummy pixel, a gate of the first PMOS transistor connected to the first dummy pixel;
a second PMOS transistor connected between the power supply voltage and the second dummy pixel, a gate of the second PMOS transistor connected to the gate of the first PMOS transistor;
a third PMOS transistor connected between the power supply voltage and the first node, a gate of the third PMOS transistor connected to the gate of the first PMOS transistor; and a fourth PMOS transistor connected between the power supply voltage and the second node, a gate of the fourth PMOS transistor connected to the gate of the first PMOS transistor.

11. An image sensor device comprising:
a first pixel configured to generate a first current;
a current mirror configured to mirror the first current to generate a mirrored current;
a second pixel configured to output a first event signal based on a first light current, the first light current being based on the mirrored current and a first light incident on the second pixel,
wherein the second pixel outputs the first event signal based on the first light current,
wherein the first event signal is output from the second pixel without synchronization with a time,
wherein the second pixel comprises:
a first current-voltage converter configured to receive the first light current, which is obtained by removing the mirrored current from a first sense current based on the first light, and convert the first light current into a first voltage;
a first time-variation circuit configured to amplify a variation of the first voltage to a first amplified voltage; and
a first event determination circuit configured to compare the first amplified voltage with a threshold value, and output the first event signal based on a result of the comparison.

12. The image sensor device of claim 11, wherein the first light current is generated by subtracting the mirrored current from the first sense current based on the first light.

13. The image sensor device of claim 11, wherein the second pixel comprises:
a first node receiving the mirrored current from the current mirror;
a first photodiode configured to generate the first sense current in response to the first light; and
a first pixel circuit configured to output the first event signal based on a variation of the first light current without the synchronization with the time.

14. The image sensor device of claim 13, further comprises:
a third pixel configured to output a second event signal based on a second light current, the second light current being based on the mirrored current and a second light incident on the third pixel,
wherein the third pixel outputs the second event signal when the variation of the second light exceeds a threshold value, and
wherein the second pixel and the third pixel output the first event signal and the second event signal without the synchronization with the time, respectively.

15. The image sensor device of claim 14, wherein the third pixel comprises:
a second node receiving the mirrored current from the current mirror;
a second photodiode configured to generate a second sense current in response to the second light; and
a second pixel circuit configured to output the second event signal based on a variation of the second light current without the synchronization with the time, and
wherein the second light current is generated by subtracting the mirrored current from the second sense current.

16. The image sensor device of claim 11, wherein the first current is a dark current.

17. An image sensor device comprising:
a dummy pixel configured to generate a dark current;
a current mirror configured to mirror the dark current to generate a mirrored current; and
a first sensing pixel configured to output a first event signal in response to a variation of a first light incident on the first sensing pixel,
wherein the first sensing pixel comprises:
a first node receiving the mirrored current;
a first photodiode configured to generate a first sense current based on the first light;
a first current-voltage converter configured to convert a first light current, which the mirrored current is removed from the first sense current, into a first voltage;
a first time-variation circuit configured to amplify a variation of the first voltage to generate a first amplified voltage; and
a first event determination circuit configured to compare the first amplified voltage with a threshold value, and output the first event signal based on a result of the comparison, without synchronization with a time.

18. The image sensor device of claim 17, wherein the first current-voltage converter comprises:
an n-type metal-oxide-semiconductor (NMOS) transistor connected between a power supply voltage and the first node; and
an amplifier connected with the first node and a gate of the NMOS transistor,
wherein the first voltage is outputted through the gate of the NMOS transistor.

19. The image sensor device of claim 17, further comprises:
a second sensing pixel configured to output a second event signal in response to a variation of a second light incident on the second sensing pixel,
wherein the second sensing pixel comprises:
a second node receiving the mirrored current;
a second photodiode configured to generate a second sense current based on the second light;
a second current-voltage converter configured to convert a second light current, which the mirrored current is removed from the second sense current, into a second voltage;
a second time-variation circuit configured to amplify a variation of the second voltage to generate a second amplified voltage; and
a second event determination circuit configured to compare the second amplified voltage with a threshold value, and output the second event signal based on a result of the comparison,
wherein the first event determination circuit and the second event determination circuit outputs the first event signal and the second event signal without the synchronization with the time, respectively.

* * * * *